United States Patent
Maeda et al.

(10) Patent No.: US 8,847,082 B2
(45) Date of Patent: Sep. 30, 2014

(54) MULTILAYER WIRING SUBSTRATE

(75) Inventors: Shinnosuke Maeda, Nagoya (JP); Satoshi Hirano, Chita-gun (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 216 days.

(21) Appl. No.: 13/109,521

(22) Filed: May 17, 2011

(65) Prior Publication Data

US 2011/0284269 A1 Nov. 24, 2011

(30) Foreign Application Priority Data

May 18, 2010 (JP) .................................. 2010-113853

(51) Int. Cl.
*H05K 1/11* (2006.01)
*H05K 3/46* (2006.01)
*H05K 3/34* (2006.01)
*H05K 3/24* (2006.01)

(52) U.S. Cl.
CPC .............. *H05K 1/113* (2013.01); *H05K 3/3436* (2013.01); *H05K 3/4682* (2013.01); *H05K 2201/09472* (2013.01); *H05K 3/244* (2013.01)
USPC .......................................... 174/262; 174/261

(58) Field of Classification Search
CPC ........... H01L 2224/73265; H01L 2224/48227; H01L 2224/27013; H01L 2224/83385; H05K 3/244; H05K 3/205; H05K 1/113; H05K 3/4007; H05K 1/111; H05K 2201/09481
USPC .................................................. 174/261, 262
See application file for complete search history.

(56) References Cited

U.S. PATENT DOCUMENTS 6,365,843 B1 * 4/2002 Shirai et al. ................... 174/262
6,660,944 B1 * 12/2003 Murata et al. ................. 174/261
7,030,496 B2 * 4/2006 Shinyama et al. ............ 257/773
(Continued)

FOREIGN PATENT DOCUMENTS

JP 2000-188460 A 7/2000
JP 2004-281914 A 10/2004
(Continued)

OTHER PUBLICATIONS

JPO, Office Action issued in corresponding application 2010-113853, mailed Jun. 18, 2013.

*Primary Examiner* — Hung S Bui
*Assistant Examiner* — James Wu
(74) *Attorney, Agent, or Firm* — Stites & Harbison, PLLC; James A. Haeberlin; James R. Hayne

(57) ABSTRACT

To provide a multilayer wiring substrate which can prevent migration of copper between wiring traces to thereby realize a higher degree of integration, a solder resist layer 25 having a plurality of openings 35, 36 is disposed on a top surface 31 side, and IC-chip connection terminals 41 and capacitor connection terminals 42 are buried in an outermost resin insulation layer 23 in contact with the solder resist layer 25. Each of the IC-chip connection terminals 41 and the capacitor connection terminals 42 is composed of a copper layer 44 and a plating layer 46 covering the outer surface of the copper layer 44. A conductor layer 26 present at the interface between the solder resist layer 25 and the resin insulation layer 23 is composed of a copper layer 27 and a nickel plating layer 28 covering the outer surface of the copper layer 27.

10 Claims, 7 Drawing Sheets

(56) References Cited

U.S. PATENT DOCUMENTS

| | | |
|---|---|---|
| 8,153,909 B2 | 4/2012 | Katagiri et al. |
| 2002/0189849 A1* | 12/2002 | Hirose et al. ............... 174/250 |
| 2004/0227239 A1* | 11/2004 | Murata et al. ............... 257/738 |
| 2005/0253263 A1* | 11/2005 | Sugimoto et al. ............ 257/737 |
| 2006/0130303 A1* | 6/2006 | Yamasaki et al. ........... 29/25.41 |
| 2006/0270211 A1 | 11/2006 | Nakamura et al. |
| 2009/0145635 A1 | 6/2009 | Shimizu |
| 2009/0236138 A1 | 9/2009 | Katagiri et al. |
| 2010/0006334 A1 | 1/2010 | Takenaka et al. |
| 2010/0132997 A1* | 6/2010 | Hando ........................ 174/262 |

FOREIGN PATENT DOCUMENTS

| | | |
|---|---|---|
| JP | 4146864 | 6/2008 |
| JP | 2009-141121 A | 6/2009 |
| JP | 2009-246357 A | 10/2009 |
| WO | 2010/004841 A1 | 1/2010 |

\* cited by examiner

-- PRIOR ART --

MULTILAYER WIRING SUBSTRATE

CROSS REFERENCE TO RELATED APPLICATIONS

The present application claims priority from Japanese Patent Application No. 2010-113853, which was filed on May 18, 2010, the disclosure of which is herein incorporated by reference in its entirety.

BACKGROUND OF THE INVENTION

1. Field of the Invention

The present invention relates to a multilayer wiring substrate having a laminate structure in which a plurality of resin insulation layers made primarily of the same resin insulation material and a plurality of wiring conductor portions are laminated alternately in multilayer arrangement, and not having a so-called substrate core in a final product, the substrate core carrying build-up layers successively formed on opposite surfaces thereof.

2. Description of Related Art

In association with recent increasing tendency toward higher operation speed and higher functionality of semiconductor integrated circuit devices (IC chips) used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package is practicalized in the form of a multilayer substrate configured such that a build-up layer is formed on the front and back surfaces of a substrate core. The substrate core used in the multilayer wiring substrate is, for example, a resin substrate (glass epoxy substrate or the like) formed by impregnating reinforcement fiber with resin. Through utilization of rigidity of the substrate core, resin insulation layers and conductor layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of semiconductor integrated circuit devices, signal frequencies to be used have become those of a high frequency band. In this case, the conductor lines which extend through the substrate core serve as sources of high inductance, leading to the transmission loss of high-frequency signals and the occurrence of circuitry malfunction and thus hindering implementation of high operation speed. In order to solve this problem, a multilayer wiring substrate having no substrate core is proposed (refer to, for example, Patent Documents 1 and 2). The multilayer wiring substrates described in Patent Documents 1 and 2 do not use a substrate core, which is relatively thick, thereby reducing the overall wiring length. Thus, the transmission loss of high-frequency signals is lowered, whereby a semiconductor integrated circuit device can be operated at high speed.

RELATED ART DOCUMENTS

Patent Documents

Patent Document 1 is Japanese Patent No. 4146864. Patent Document 2 is Japanese Patent Application Laid-open (kokai) No. 2009-141121.

BRIEF SUMMARY OF THE INVENTION

Incidentally, in the above-described multilayer wiring substrate, the pitch of wiring traces formed on the surface on which an IC chip is mounted is finer than the pitch of wiring traces formed on the surface to which a motherboard is connected, and the spacing between the connection terminals formed on the IC-chip mounting surface is very small. Furthermore, copper used to form the wiring traces and the connection terminals is a metal which easily causes migration. Therefore, in the case where not only connection terminals but also wiring traces are formed on the IC-chip mounting surface in order to increase the degree of integration of the multilayer wiring substrate, migration of copper occurs between the terminals and the wiring traces, which makes it difficult to secure the reliability of the multilayer wiring substrate.

Incidentally, in the conventional multilayer wiring substrate described in Patent Document 1, each connection terminal 101 for connection with an IC chip is buried in an insulation layer 102, and a peripheral portion of a terminal outer surface 101a is covered by a solder resist layer 103 (see FIG. 16). Each connection terminal 101 has two plating layers; i.e., a nickel plating layer 105a and a gold plating layer 105b, formed on the surface of a copper layer 104, which constitutes the main body of the connection terminal 101. Since the plating layers 105a, 105b are formed on the surface of the connection terminal 101, migration of copper between the connection terminals 101 can be restrained. However, when a bump of solder 110 is formed on the connection terminal 101, gold which is present on the surface layer side of the connection terminal 101 diffuses into the molten solder 110, and a clearance is formed between the outer surface 101a of the connection terminal 101 and the solder resist layer 103 along the circumference of the terminal outer surface 101a. In such a case, since the solder resist layer 103 and the connection terminal 101 do not adhere together, the adhesion strength of the connection terminal 101 drops. Accordingly, in such a case, it becomes difficult to manufacture a wiring substrate of high reliability.

Moreover, in the multilayer wiring substrate described in Patent Document 1, only the connection terminals 101 are formed on the IC-chip mounting surface. In the case where an attempt is made to increase the degree of integration of the wiring substrate by forming the wiring traces on the IC-chip mounting surface, migration of copper between the wiring traces may occur, because the wiring traces have conventionally been formed by a copper layer only.

The present invention has been conceived in view of the above problems, and an object of the invention is to provide a multilayer wiring substrate which can prevent migration of copper between wiring traces to thereby realize a higher degree of integration.

A means (Means 1) for solving the above problems is a multilayer wiring substrate having a laminate structure in which a plurality of resin insulation layers made primarily of the same resin insulation material, and a plurality of wiring conductor portions are laminated alternately in multilayer arrangement, a plurality of first-main-surface-side connection terminals being disposed on one side of the laminate structure where a first main surface thereof is present (a first main surface side), a plurality of second-main-surface-side connection terminals being disposed on the other side of the laminate structure where a second main surface thereof is present (a second main surface side), the plurality of wiring conductor portions being formed in the plurality of resin insulation layers and interconnected by means of via conductors whose diameters increase toward the first main surface or the second main surface, the multilayer wiring substrate being characterized in that (wherein) a resin insulation layer for resist (a solder resist layer) having a plurality of openings is disposed on the first main surface side or the second main surface side of the laminate structure; each of the plurality of first-main-surface-side connection terminals or the plurality of second-main-surface-side connection terminals is composed of (comprises) a copper layer (mainly constituting the terminal) and a coating metallic layer covering an outer surface of the copper layer, and is at least partially buried (embedded) in an outermost resin insulation layer in contact with the resin insulation layer for resist (solder resist layer); each of outermost wiring conductor portions present at an interface between the resin insulation layer for resist (solder resist layer) and the outermost resin insulation layer is composed of a copper layer (mainly constituting the outermost conductive layer) and a conductive metallic layer covering an outer surface of the copper layer; and the conductive metallic layer is formed of (comprises) at least one conductive metal selected from gold, chromium, tungsten, platinum, palladium, tin, lead, nickel, cobalt, molybdenum, tantalum, and titanium.

According to the invention described in Means 1, the multilayer wiring substrate is formed such that a plurality of resin insulation layers made primarily of the same resin insulation material, and a plurality of wiring conductor portions are laminated alternately, and assumes the form of a coreless wiring substrate having no substrate core. In this multilayer wiring substrate, the plurality of first-main-surface-side connection terminals or the plurality of second-main-surface-side connection terminals are at least partially buried in the outermost resin insulation layer in contact with the resin insulation layer for resist (solder resist layer). Therefore, the insulation reliability of each connection terminal can be enhanced. Moreover, in the present invention, the outer surface of the copper layer of each wiring conductor portion is covered by a conductive metallic layer formed of a conductive metal selected from gold, chromium, tungsten, platinum, palladium, tin, lead, nickel, cobalt, molybdenum, tantalum, and titanium, which are less likely to cause migration as compared with copper. Since this configuration reliably prevents migration of copper between the wiring conductor portions, the degree of integration of the multilayer wiring substrate can be increased.

Preferably, the outermost wiring conductor portions are buried in the outermost resin insulation layer. In this case, the wiring conductor portions are present at the same interface as the plurality of first-main-surface-side connection terminals or the plurality of second-main-surface-side connection terminals. Since the wiring conductor portions are buried in the outermost resin insulation layer as in the case of the connection terminals, a sufficient degree of insulation can be secured between the wiring conductor portions (e.g., wiring traces) and between the wiring conductor portions and the connection terminals. Accordingly, the wiring traces can be provided at a relatively narrow pitch, whereby the degree of integration of the multilayer wiring substrate can be increased.

Preferably, the resin insulation layer for resist (solder resist layer) is disposed on the first-main-surface side of the laminate structure, and a plurality of IC-chip connection terminals to which an IC chip is to be connected are present on the first-main-surface side as the first-main-surface-side connection terminals. In this case, on the first-main-surface side of the laminate structure, migration between the wiring traces and the IC-chip connection terminals formed at a relatively narrow pitch can be prevented reliably. Therefore, the degree of integration of the multilayer wiring substrate can be increased. Notably, the resin insulation layer for resist (solder resist layer) may be provided on the side opposite the first main surface on which the IC chip is mounted; specifically, on the second main surface to which a motherboard is connected.

Preferably, the coating metallic layer of each of the plurality of first-main-surface-side connection terminals or the plurality of second-main-surface-side connection terminals, and the conductive metallic layer of each outermost wiring conductor portion are made by use of a common conductive metal. In this case, the coating metallic layer of each connection terminal and the conductive metallic layer of each wiring conductor portion can be formed in the same manufacturing step (e.g., a plating step), whereby production cost of the multilayer wiring substrate can be suppressed.

Preferably, the coating metallic layer is at least partially covered by the resin insulation layer for resist (solder resist layer). In this case, a solder bump can be reliably formed on each connection terminal. Moreover, preferably each of the coating metallic layer and the conductive metallic layer is made primarily of nickel. By means of covering with nickel the outer surface of the copper layer which constitutes each of the connection terminals and the wiring conductor portions, migration of copper can be prevented reliably. Furthermore, nickel is a highly reliable conductive metal which has been conventionally used to form a plating layer for covering connection terminals. Therefore, even in the case where a metallic layer formed of nickel is provided on the connection terminals and the wiring conductor portions, satisfactory electrical characteristics of the multilayer wiring substrate can be secured.

The multilayer wiring substrate may be configured such that the coating metallic layer of each of the first-main-surface-side connection terminals or the second-main-surface-side connection terminals is composed of a nickel plating layer and a gold plating layer; the nickel plating layer is provided to cover the outer surface of the copper layer; and the gold plating layer is provided to cover only a portion of the nickel plating layer exposed from an opening of the resin insulation layer for resist (solder resist layer). In this case, the resin insulation layer for resist (solder resist layer) comes into contact with a peripheral portion of the nickel plating layer. In this configuration, since the gold plating layer does not exist at the interface between each terminal and the resin insulation layer for resist (solder resist layer), there can be avoided the conventional problem; i.e., formation of a clearance between the resin insulation layer for resist (solder resist layer) and a peripheral portion of the terminal outer surface at the time of solder connection. Therefore, the adhesion strength between the resin insulation layer for resist (solder resist layer) and each connection terminal can be secured sufficiently.

The terminal outer surfaces of the first-main-surface-side connection terminals or the second-main-surface-side connection terminals may be formed to be located on the inner surface side in relation to the surface of the outermost resin insulation layer. Since this configuration increases the adhesion area of the resin insulation layer for resist (solder resist layer), the strength of the multilayer wiring substrate can be increased more.

The via conductors formed in the plurality of resin insulation layers may be shaped such that their diameters increase in a direction from the first main surface side toward the second main surface side. By contrast, the via conductors formed in the plurality of resin insulation layers may also be shaped such that their diameters increase in a direction from the second main surface side toward the first main surface side. Through employment of this diametral feature, a coreless wiring substrate having no substrate core can be reliably manufactured.

Preferred examples of a polymeric material used to form the plurality of resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin. Additionally, there may be used a composite material consisting of any one of these resins, and glass fiber (glass woven fabric or glass nonwoven fabric) or organic fiber, such as polyamide fiber, or a resin-resin composite material in which a three-dimensional network fluorine-containing resin base material, such as continuously porous PTFE, is impregnated with a thermosetting resin, such as epoxy resin. Notably, in the present invention, "a plurality of resin insulation layers made primarily of the same resin insulation material" may be a plurality of resin insulation layers which differ in additive, such as the above-mentioned organic fiber, which is mixed with, for example, thermo setting resin, if the resin insulation layers are mainly formed of the same thermo setting resin.

The resin insulation layer for resist (solder resist layer) is an insulation layer which prevents adhesion of solder during soldering work, and is formed by use of a heat resistant coating material. Notably, the resin insulation layer for resist (solder resist layer) and the plurality of resin insulation layers may be made primarily of the same resin insulation material. This configuration restrains difference in thermal expansion coefficient. As a result, warpage of the multilayer wiring substrate can be suppressed.

Other features and advantages of the invention will be set forth in or apparent from the detailed description of exemplary embodiments of the invention found below.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

First Embodiment

Figure 1:
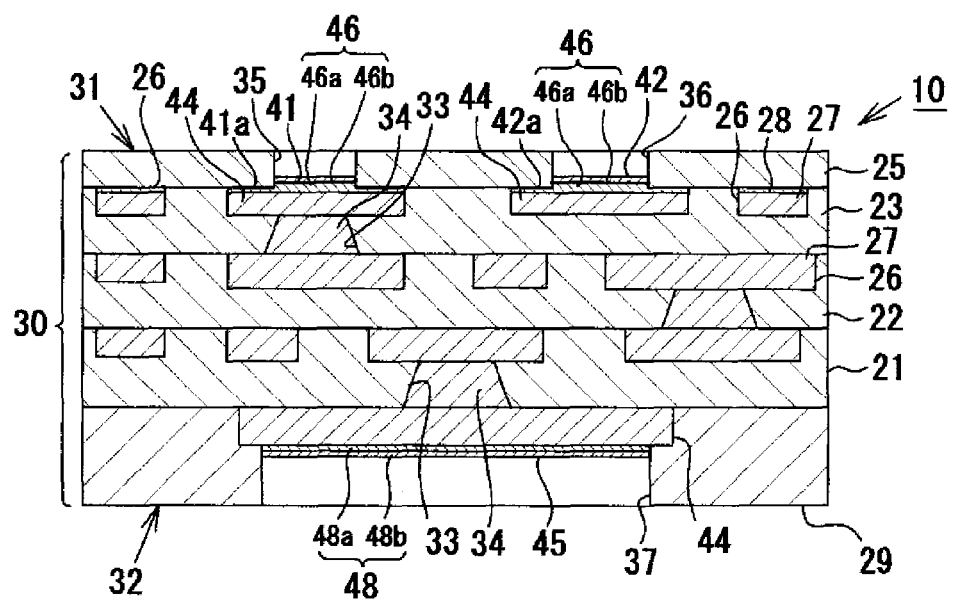
FIG. 1 is an enlarged sectional view schematically showing the structure of a multilayer wiring substrate according to a first embodiment.
Figure 2:
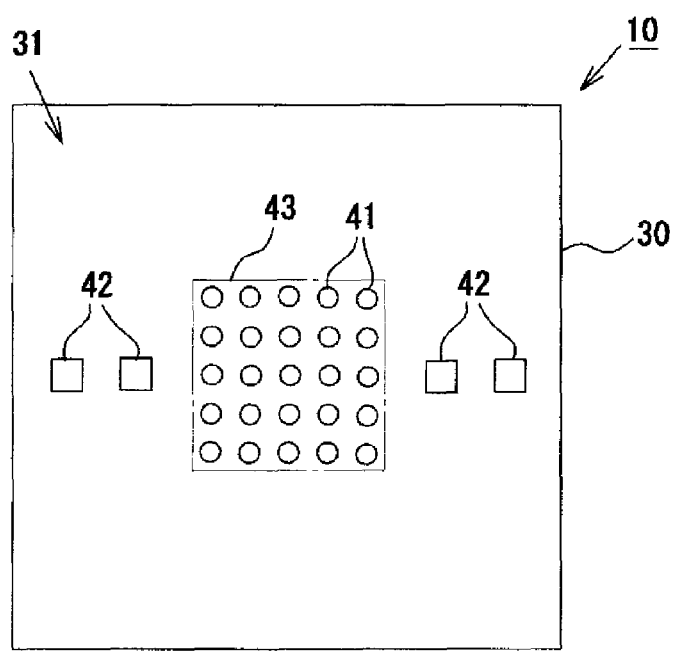
FIG. 2 is a plan view schematically showing the structure of the multilayer wiring substrate according to the first embodiment.
Figure 3:
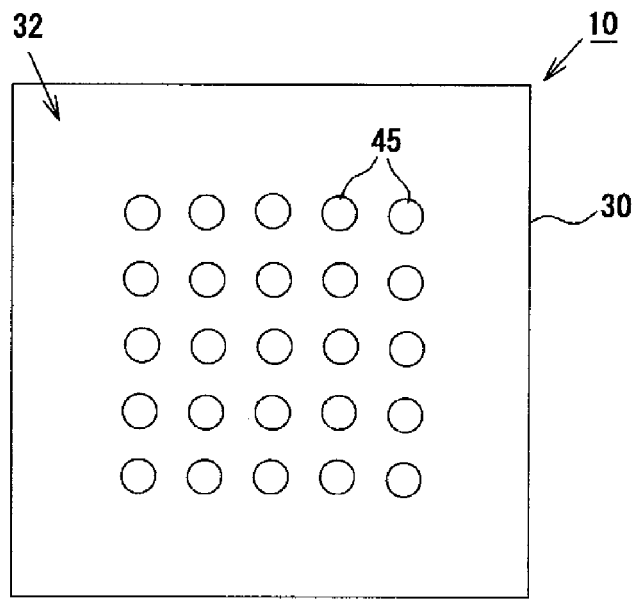
FIG. 3 is a plan view schematically showing the structure of the multilayer wiring substrate according to the first embodiment.

A multilayer wiring substrate according to a first embodiment of the present invention will next be described in detail with reference to the drawings. FIG. 1 is an enlarged sectional view schematically showing the structure of the multilayer wiring substrate of the present embodiment. FIG. 2 is a plan view of the multilayer wiring substrate as viewed from the top surface side. FIG. 3 is a plan view of the multilayer wiring substrate as viewed from the bottom surface side.

As shown in FIG. 1, a multilayer wiring substrate 10 is a coreless wiring substrate having no substrate core and has a multilayer wiring laminate portion 30 (laminate structure) in which a plurality of resin insulation layers 21, 22, and 23 made primarily of the same resin insulation material, and a plurality of conductor layers 26 (wiring conductor portions) made of copper are laminated alternately. The resin insulation layers 21 to 23 are formed of a build-up material made primarily of a hardened resin insulation material that is not photocurable; specifically, a hardened thermosetting epoxy resin. In the multilayer wiring substrate 10, a plurality of connection terminals 41 and 42 (first-main-surface-side connection terminals) are disposed on one side (first main surface side) of the wiring laminate portion 30 where a top surface 31 thereof is present.

As shown in FIGS. 1 and 2, in the multilayer wiring substrate 10 of the present embodiment, the plurality of connection terminals 41 and 42 disposed on the top surface 31 side of the wiring laminate portion 30 are IC-chip connection terminals 41 to which an IC chip is to be connected, and capacitor connection terminals 42 to which chip capacitors are to be connected. On the top surface 31 side of the wiring laminate portion 30, the plurality of IC-chip connection terminals 41 are arrayed in a chip mounting region 43 provided at a central portion of the multilayer wiring substrate 10. The capacitor connection terminals 42 are greater in area than the IC-chip connection terminals 41 and are disposed externally of the chip mounting region 43.

Meanwhile, as shown in FIGS. 1 and 3, on the other side (second main surface side) of the wiring laminate portion 30 where a bottom surface 32 thereof is present, a plurality of connection terminals 45 (motherboard connection terminals serving as second-main-surface-side connection terminals) for LGA (land grid array) to which a motherboard is connected are arrayed. The motherboard connection terminals 45 are greater in area than the IC-chip connection terminals 41 and the capacitor connection terminals 42 on the top surface 31 side.

Via holes 33 and filled via conductors 34 are provided in the resin insulation layers 21, 22, and 23. The via conductors 34 are shaped such that their diameters increase in the same direction (in FIG. 1, in the direction from the top surface toward the bottom surface). The via conductors 34 electrically interconnect the conductor layers 26, the IC-chip connection terminals 41, the capacitor connection terminals 42, and the motherboard connection terminals 45.

On the top surface 31 side of the wiring laminate portion 30, the surface of the outermost resin insulation layer 23 is covered substantially completely by a solder resist layer 25 (a resin insulation layer for resist). The solder resist layer 25 has a plurality of openings 35, 36 formed therein so as to expose the IC-chip connection terminals 41 and the capacitor connection terminals 42. The solder resist layer 25 of the present embodiment is made primarily of a hardened photocurable resin material.

Figure 4:
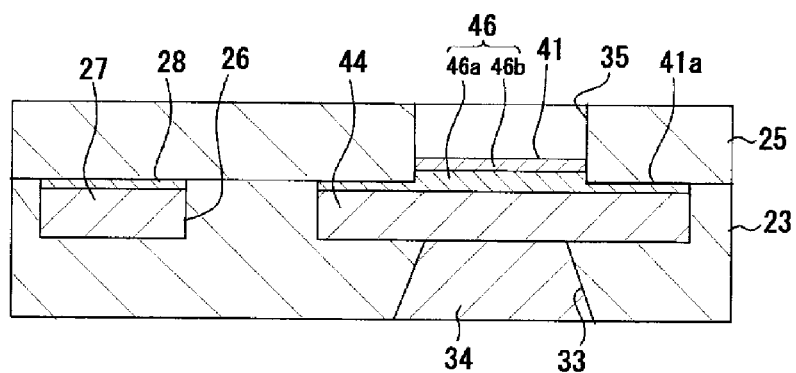
FIG. 4 is an enlarged sectional view showing the structure of an IC-chip connection terminal according to the first embodiment.

As shown in FIGS. 1 and 4, each of the IC-chip connection terminals 41 is composed of a copper layer 44 (main body) and a plating layer 46 (coating metallic layer) which covers the outer surface of the copper layer 44. Similarly, each of the capacitor connection terminals 42 is composed of a copper layer 44 (main body) and a plating layer 46 (coating metallic layer) which covers the outer surface of the copper layer 44. The plating layer 46 is composed of a nickel plating layer 46a and a gold plating layer 46b. In the present embodiment, the nickel plating layer 46a is provided to cover the entirety of the terminal outer surface 41a, 42a of each connection terminal 41, 42 (the entire outer surface of the copper layer 44). A central portion of the nickel plating layer 46a exposed within the corresponding opening 35, 36 of the solder resist layer 25 is thicker than the peripheral portion thereof. Further, the gold plating layer 46b is provided to cover the central portion (exposed portion) of the nickel plating layer 46a exposed at the opening 35, 36.

Each of the IC-chip connection terminals 41 and the capacitor connection terminals 42 is buried (i.e., embedded or recessed) in the outermost resin insulation layer 23 in contact with the solder resist layer 25, and the gold plating layer 46b, which partially constitutes the plating layer 46, is exposed through the opening 35, 36 of the solder resist layer 25. Furthermore, on the terminal outer surface 41a, 42a of each connection terminal 41, 42, a peripheral portion of the nickel plating layer 46a, which partially constitutes the plating layer 46, is in contact with the solder resist layer 25. That is, at the connection interface between the terminal outer surfaces 41a, 42a of the connection terminals 41, 42 and the solder resist layer 25, only the nickel plating layer 46a exists, and the gold plating layer 46b does not exist.

In the present embodiment, the IC-chip connection terminals 41 and the capacitor connection terminals 42 are present at the interface between the solder resist layer 25 and the outermost resin insulation layer 23, and the conductor layers 26 (wiring conductor portions) are formed at the same interface. As in the case of the connection terminals 41 and 42, the conductor layers 26 are also buried (i.e., embedded or recessed) in the outermost resin insulation layer 23. Each of the outermost conductor layers 26 is composed of a copper layer 27 (main body) and a nickel plating layer 28 (conductive metallic layer) which covers the outer surface of the copper layer 27. Meanwhile, the conductor layers 26 formed in the inner resin insulation layers 21, 22 are formed of the copper layer 27 only.

On the bottom surface 32 side of the wiring laminate portion 30, the surface of the outermost resin insulation layer 21 is covered substantially completely by a solder resist layer 29. The solder resist layer 29 has openings 37 formed therein so as to expose the motherboard connection terminals 45. The solder resist layer 29 is formed primarily of a hardened photocurable resin material. Each of the motherboard connection terminals 45 is mainly constituted by a copper layer 44. In each motherboard connection terminal 45, a peripheral portion of the main-surface-side surface of the copper layer 44 is covered by the solder resist layer 29. A plating layer 48 formed of a metal other than copper (specifically, a nickel plating layer 48a and a gold plating layer 48b) is formed at a central portion of the copper layer 44 exposed through the corresponding opening 37. A motherboard is connected to the motherboard connection terminals 45 via unillustrated solder bumps formed thereon.

The thus-configured multilayer wiring substrate 10 is fabricated by, for example, the following procedure.

First, a support substrate (a glass epoxy substrate or the like) having sufficient strength is prepared. On the support substrate, the resin insulation layers 21 to 23 and the conductor layers 26 are alternately built up, thereby forming the wiring laminate portion 30.

Figure 5:
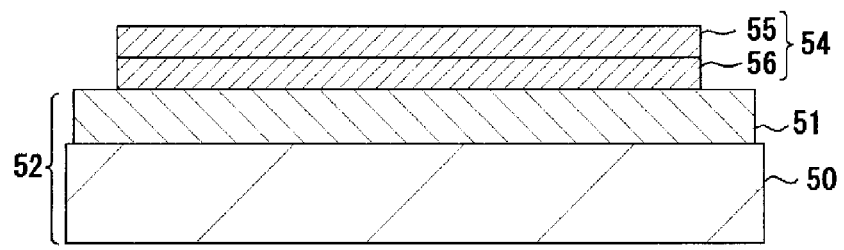
FIG. 5 is an explanatory view showing a method of manufacturing the multilayer wiring substrate according to the first embodiment.

More specifically, as shown in FIG. 5, a sheet-like electrically insulative resin base material made of epoxy resin and serving as a ground resin insulation layer 51 is attached onto a support substrate 50, thereby yielding a base material 52 consisting of the support substrate 50 and the ground resin insulation layer 51. Then, a metal laminate sheet 54 is disposed on the upper surface of the ground resin insulation layer 51 of the base material 52. Through disposition of the metal laminate sheet 54 on the ground resin insulation layer 51, there is ensured such adhesion that, in the subsequent fabrication process, the metal laminate sheet 54 is not separated from the ground resin insulation layer 51. The metal laminate sheet 54 is configured such that two copper foils 55 and 56 (a pair of metal foils) are separably in close contact with each other. Specifically, the copper foils 55 and 56 are laminated together with metal plating (e.g., chromium plating, nickel plating, titanium plating, or composite plating thereof) intervening therebetween, thereby forming the metal laminate sheet 54.

Figure 6:
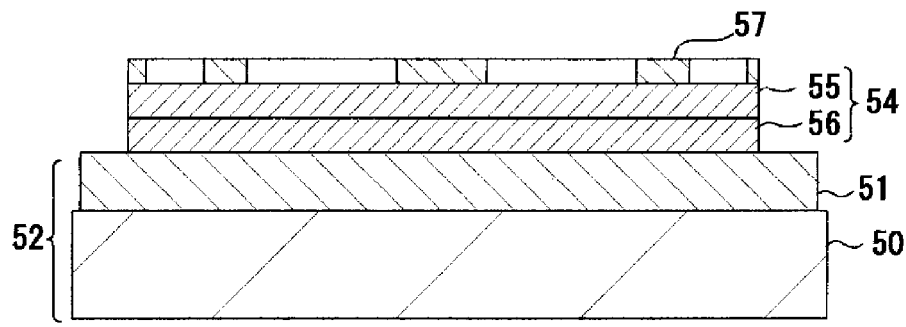
FIG. 6 is an explanatory view showing the method of manufacturing the multilayer wiring substrate according to the first embodiment.
Figure 7:
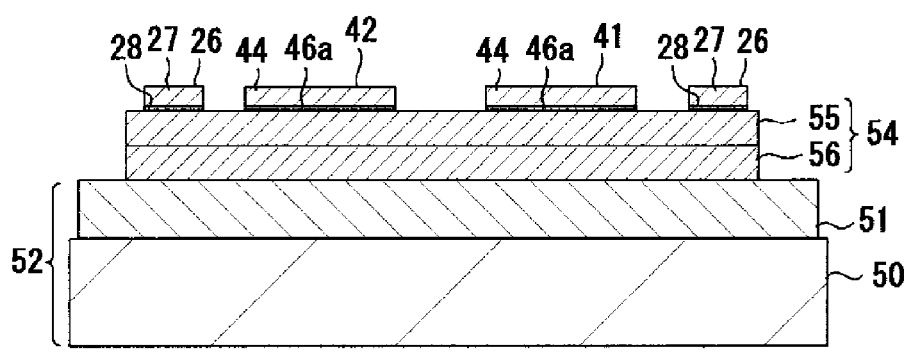
FIG. 7 is an explanatory view showing the method of manufacturing the multilayer wiring substrate according to the first embodiment.

Next, a dry film for forming a plating resist layer is laminated on the upper surface of the metal laminate sheet 54, and exposure and development are carried out for the dry film. As a result, there is formed a plating resist layer 57 of a predetermined pattern, which has openings at positions corresponding to the connection terminals 41, 42 and the conductor layers 26 (see FIG. 6). Furthermore, nickel electroplating and copper electroplating are successively and selectively performed with the plating resist layer 57 formed, whereby plating portions which are to become the nickel plating layers 46a, 28 of the connection terminals 41, 42 and the conductor layers 26 and plating portions which are to become the copper layers 44, 27 are formed in the openings. The plating resist layer 57 is then peeled off (see FIG. 7). Furthermore, in order to enhance adhesion between the copper layers 44, 27 and the resin insulation layer 23, the surfaces of the copper layers 44, 27 are roughened (treatment performed by use of a CZ-series etching agent available from MEC Co., Ltd.).

Figure 8:
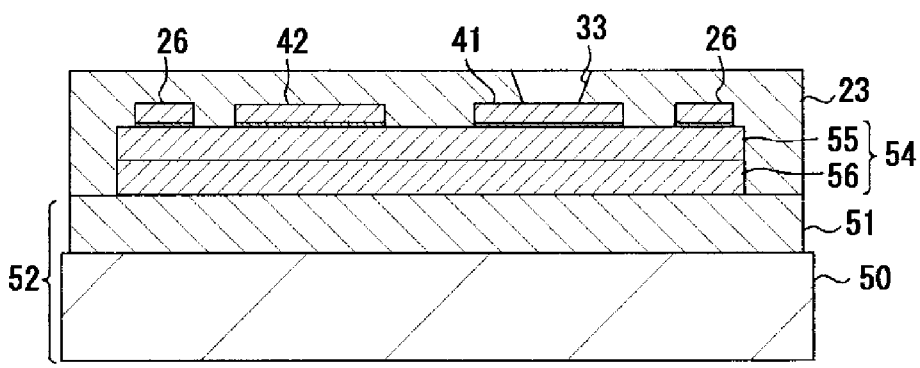
FIG. 8 is an explanatory view showing the method of manufacturing the multilayer wiring substrate according to the first embodiment.

After that, a sheet-like resin insulation layer 23 is disposed on and attached onto the base material 52 in such a manner as to cover the metal laminate sheet 54, on which the plating portions of the connection terminals 41, 42 and the conductor layers 26 have been formed. This resin insulation layer 23 comes into close contact with the metal laminate sheet 54, and the plating portions of the connection terminals 41, 42 and the conductor layers 26. The resin insulation layer 23 also comes into close contact with the ground resin insulation layer 51 in a region around the metal laminate sheet 54, thereby sealing the metal laminate sheet 54. The via holes 33 are then formed in the resin insulation layer 23 at predetermined positions (positions above the connection terminals 41) by means of performing laser beam machining by use of, for example, an excimer laser, a UV laser, or a $CO_2$ laser (see FIG. 8).

Next, by use of etchant, such as a potassium permanganate solution, a desmear step is performed for removing smears from inside the via holes 33. In the desmear step, in place of treatment by use of etchant, plasma asking by use of, for example, $O_2$ plasma may be performed. After the desmear step, electroless copper plating and copper electroplating are performed by a known process, thereby forming the via conductors 34 in the via holes 33. Further, etching is performed by a known process (e.g., semi-additive process), thereby forming the conductor layer 26 in a predetermined pattern on the resin insulation layer 23.

Also, other resin insulation layers 22 and 21 and the corresponding conductor layers 26 are formed and laminated on the resin insulation layer 23 by processes similar to those used to form the resin insulation layer 23 and the associated conductor layers 26. Subsequently, the motherboard connection terminals 45 are formed on the outermost resin layer 21. Furthermore, photosensitive epoxy resin is applied onto the outermost resin layer 21 and is cured so as to form the solder resist layer 29. Exposure and development are then performed with a predetermined mask placed thereon so as to form the openings 37 in the solder resist layer 29. As a result, central portions of the motherboard connection terminals 45 are exposed from the openings 37 of the solder resist layer 29 (see FIG. 9).

Figure 9:
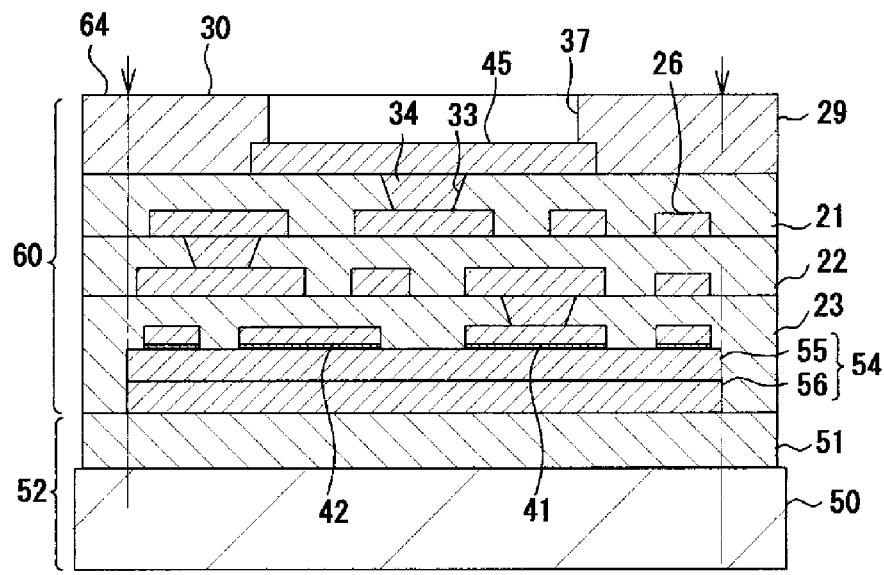
FIG. 9 is an explanatory view showing the method of manufacturing the multilayer wiring substrate according to the first embodiment.

By the above-described build-up step, there is formed a wiring laminate 60 in which the metal laminate sheet 54, the resin insulation layers 21 to 23, and the conductor layers 26 are laminated on the base material 52. Notably, as shown in FIG. 9, a portion of the wiring laminate 60 which is located above the metal laminate sheet 54 will become the wiring laminate portion 30 of the multilayer wiring substrate 10.

After the build-up step, the wiring laminate 60 is cut by a dicing apparatus (not shown) so as to remove a surrounding portion around the wiring laminate portion 30. At this time, as shown in FIG. 9, cutting progresses along the boundary (indicated by the arrows in FIG. 9) between the wiring laminate portion 30 and a surrounding portion 64 and along the extension of the boundary for further cutting of the base material 52 (the support substrate 50 and the ground resin insulation layer 51) located under the wiring laminate portion 30. As a result of this cutting, a peripheral edge portion of the metal laminate sheet 54 which has been sealed by the resin insulation layer 23 is exposed. That is, as a result of removal of the surrounding portion 64, a bonded portion between the ground resin insulation layer 51 and the resin insulation layer 23 is lost. Consequently, the wiring laminate portion 30 and the base material 52 are connected together merely through the metal laminate sheet 54.

Figure 10:
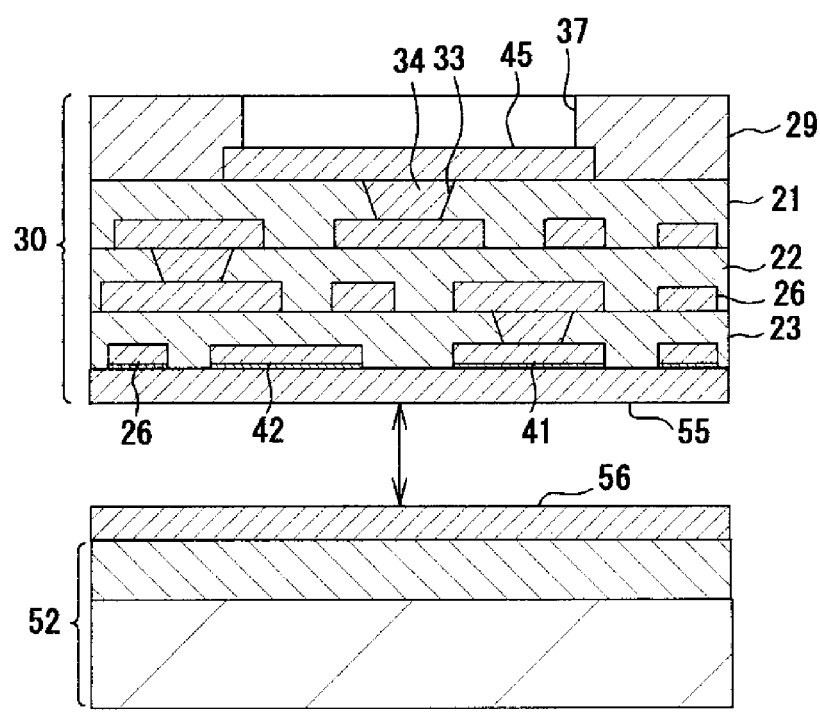
FIG. 10 is an explanatory view showing the method of manufacturing the multilayer wiring substrate according to the first embodiment.

As shown in FIG. 10, the wiring laminate portion 30 and the base material 52 are separated from each other at the interface between the copper foils 55 and 56 of the metal laminate sheet 54, thereby removing the base material 52 from the wiring laminate portion 30 and exposing the copper foil 55 present on the bottom surface of the wiring laminate portion 30 (the resin insulation layer 23). Furthermore, on the bottom surface side of the wiring laminate portion 30, the exposed copper foil 55 is removed through etching (base-material removing step).

Figure 11:
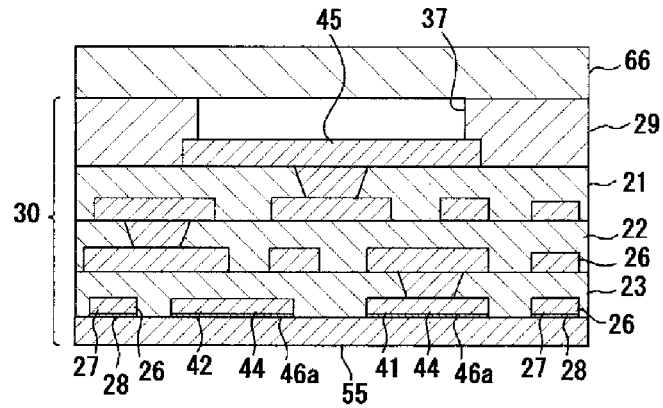
FIG. 11 is an explanatory view showing the method of manufacturing the multilayer wiring substrate according to the first embodiment.
Figure 12:
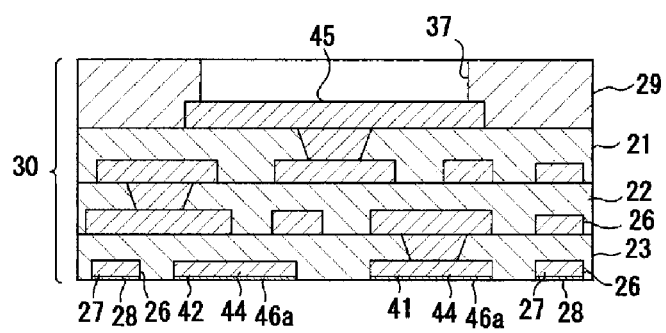
FIG. 12 is an explanatory view showing the method of manufacturing the multilayer wiring substrate according to the first embodiment.

Specifically, a dry film for forming an etching resist layer is laminated on the top surface of the wiring laminate portion 30, and exposure and development are performed for the dry film to thereby form an etching resist layer 66 which covers the entirety of the top surface (see FIG. 11). In this state, etching is performed for the wiring laminate portion 30 so as to remove the entire copper foil 55. After the etching, the etching resist layer 66 formed on the top surface of the wiring laminate portion 30 is removed. As a result, the surface of the resin insulation layer 23 is exposed, and the surfaces of the IC-chip connection terminals 41, the capacitor connection terminals 42, and the conductor layers 26 (the surfaces of the nickel plating layers 46a and 28) are exposed (see FIG. 12). Notably, at that time, since the nickel plating layers 46a, 28 located on the surface sides of the copper layer 44, 27 of the connection terminals 41, 42 and the conductor layers 26 are lower in etching rate than copper, each of the nickel plating layers serves as an etching stop layer, and remains on the surface of the copper layer 44, 27.

Next, photosensitive epoxy resin is applied onto the resin insulation layer 23 and is cured so as to form the solder resist layer 25. Exposure and development are then performed with a predetermined mask placed thereon so as to form the openings 35, 36 in the solder resist layer 25. As a result, central portions of the main-surface-side surfaces of the connection terminals 41, 42 are exposed from the openings 35, 36 of the solder resist layer 25.

After that, electroless nickel plating and electroless gold plating are successively performed on the surfaces (upper surfaces) of the connection terminals 41, 42, 45 exposed from the openings 35 to 37, to thereby form plating layers 46, 48 (plating step). The multilayer wiring substrate 10 of FIG. 1 is manufactured through the above-described steps.

Therefore, the present embodiment can yield the following effects.

(1) In the multilayer wiring substrate 10 of the present embodiment, the plurality of IC-chip connection terminals 41 and the plurality of capacitor connection terminals 42 are buried (embedded) in the outermost resin insulation layer 23 in contact with the solder resist layer 25. The outermost conductor layers 26 are also buried (embedded) in the outermost resin insulation layer 23. By virtue of this configuration, the resin insulation layer 23 having an excellent insulation performance is interposed between the conductor layers 26 forming a wiring pattern and between the connection terminals 41, 42. Therefore, the insulation of the conductor layers 26 and the connection terminals 41, 42 can be secured satisfactorily. Furthermore, each of the IC-chip connection terminals 41 and the capacitor connection terminals 42 is composed of the copper layer 44 (main body) and the plating layer 46, which covers the outer surface of the copper layer 44, and a peripheral portion of the plating layer 46 is covered by the solder resist layer 25. Therefore, solder bumps can be reliably formed on the connection terminals 41, 42. Moreover, since the outer surface of the copper layer 27 is covered with the nickel plating layer 28 which is less likely to migrate as compared with copper, migration of copper between the conductor layers 26 can be prevented. As a result, wiring traces can be provided at a relatively narrow pitch, whereby the degree of integration of the multilayer wiring substrate 10 can be increased.

(2) In the present embodiment, the nickel plating layer 46a of the plating layer 46, which partially constitutes each of the plurality of IC-chip connection terminals 41 and the plurality of capacitor connection terminals 42, and the nickel plating layer 28, which partially constitutes the outermost conductor layer 26, are formed by use of a common conductive metal; i.e., nickel. In this case, since the nickel plating layer 46a of each connection terminal 41, 42 and the nickel plating layer 28 of each conductor layer 26 can be formed in the same plating step, production cost of the multilayer wiring substrate 10 can be reduced. The nickel plating layer is a highly reliable conductive metallic layer which has been conventionally used as a plating layer for covering connection terminals. Therefore, even in the case where the nickel plating layer 28 is formed on the outermost conductor layer 26, satisfactory electrical characteristics of the multilayer wiring substrate 10 can be secured.

(3) In the multilayer wiring substrate 10 of the present embodiment, since the peripheral portion of the terminal outer surface 41a, 42a of each of the IC-chip connection terminals 41 and the capacitor connection terminals 42 is covered by the solder resist layer 25, the strength of each connection terminal 41, 42 can be increased sufficiently. Furthermore, the solder resist layer 25 is in contact with the peripheral portion of the nickel plating layer 46a which covers the copper layer 44 in each connection terminal 41, 42. That is, the gold plating layer 46b does not exist at the interface between the solder resist layer 25 and the terminal outer surface 41a, 42a of each connection terminal 41, 42. This configuration solves the problem of gold of the plating layer 46 diffusing into molten solder, resulting in formation of a clearance between the terminal outer surface 41a, 42a and the solder resist layer 25. As a result, even after formation of a solder bump on each connection terminal 41, 42, the solder resist layer 25 and each connection terminal 41, 42 can be adhered reliably, and each connection terminal 41, 42 can have a sufficient adhesion strength.

Second Embodiment

Figure 13:
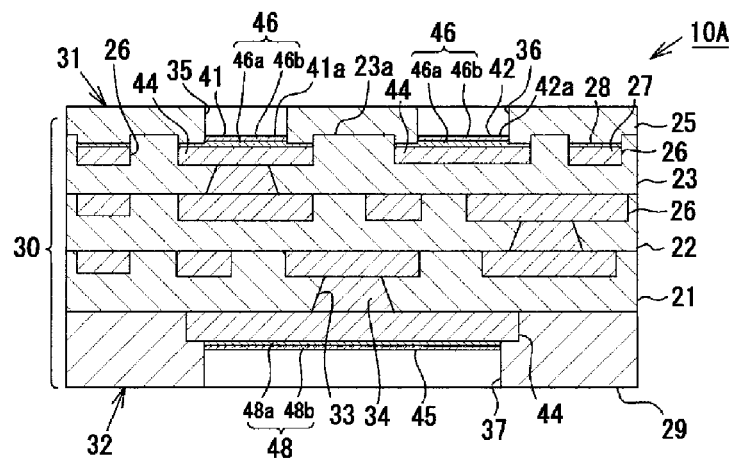
FIG. 13 is an enlarged sectional view schematically showing the structure of a multilayer wiring substrate according to a second embodiment.
Figure 14:
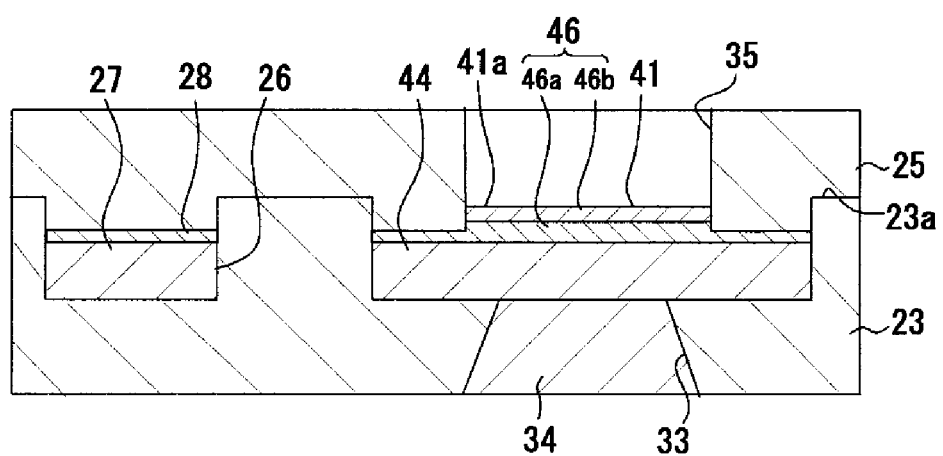
FIG. 14 is an enlarged sectional view showing the structure of an IC-chip connection terminal according to the second embodiment.

Next, a second embodiment of the present invention will be described with reference to FIGS. 13 and 14. As shown in FIGS. 13 and 14, in a multilayer wiring substrate 10A of the present embodiment, the IC-chip connection terminals 41 and the capacitor connection terminals 42 are formed such that the terminal outer surfaces 41a, 42a are located on the inner layer side in relation to (i.e., recessed from) the outer surface 23a of the outermost resin insulation layer 23. Furthermore, the outmost conductor layers 26 present at the interface between the solder resist layer 25 and the resin insulation layer 23 are also formed to be located on the inner layer side in relation to (i.e., recessed from) the outer surface 23a of the outermost resin insulation layer 23. Notably, the remaining structure of the multilayer wiring substrate 10A is the same as that of the multilayer wiring substrate 10 of the first embodiment.

In the present embodiment, the step of forming the plating portions of the copper layers 44, 27 and the nickel plating layers 46a, 28, which constitute the connection terminals 41, 42 and the conductor layers 26 differs from that of the first embodiment. That is, copper electroplating, nickel electroplating, and copper electroplating are successively performed in a state in which the plating resist layer 57 having openings at positions corresponding to the connection terminals 41, 42 and the conductor layers 26 is formed on the upper surface of the metal laminate sheet 54 disposed on the base material 52 (see FIG. 6). In the first embodiment, nickel electroplating and copper electroplating are performed in this step, whereby plating portions which are to become the nickel plating layers 46a, 28, and plating portions which are to become the copper layers 44, 27 are formed. In the present embodiment, in addition to these plating portions, a copper plating portion is interposed between the nickel plating layers 46a, 28 and the metal laminate sheet 54. After that, the build-up step and the base material removing step are performed as in the case of the first embodiment.

After the base material removing step, the copper plating portion present between the copper foil 55 and the nickel plating layers 46a, 28 is removed through etching along with the copper foil 55. As a result, recesses are formed in the resin insulation layer 23, and the connection terminals 41, 42 and the conductor layers 26, which are composed of the copper layers 44, 27 and the nickel plating layers 46a, 28, are located below (inward of) the recesses. After that, the solder resist layer 25 is formed on the resin insulation layer 23, and the openings 35, 36 are formed in the solder resist layer 25 so as to expose the surfaces of the connection terminals 41, 42.

After that, electroless nickel plating and electroless gold plating are successively performed on the surfaces (upper surfaces) of the connection terminals 41, 42, 45 exposed from the openings 35 to 37, to thereby form the plating layers 46, 48. The multilayer wiring substrate 10A of FIG. 13 is manufactured through the above-described steps.

When the multilayer wiring substrate 10A is formed in the above-described manner, since the adhesion area between the solder resist layer 25 and the outermost resin insulation layer 23 increases, the strength of the multilayer wiring substrate 10A can be increased sufficiently. Furthermore, in the multilayer wiring substrate 10A, as in the case of the first embodiment, the outer surface of the copper layer 27 of each conductor layer 26 is covered with the nickel plating layer 28. Therefore, occurrence of migration of copper between the conductor layers 26 can be prevented. In particular, since the conductor layers 26 are provided at a deep position in the resin insulation layer 23 having a high insulation performance, migration can be prevented more reliably.

Notably, the embodiments of the present invention may be modified as follows.

Figure 15:
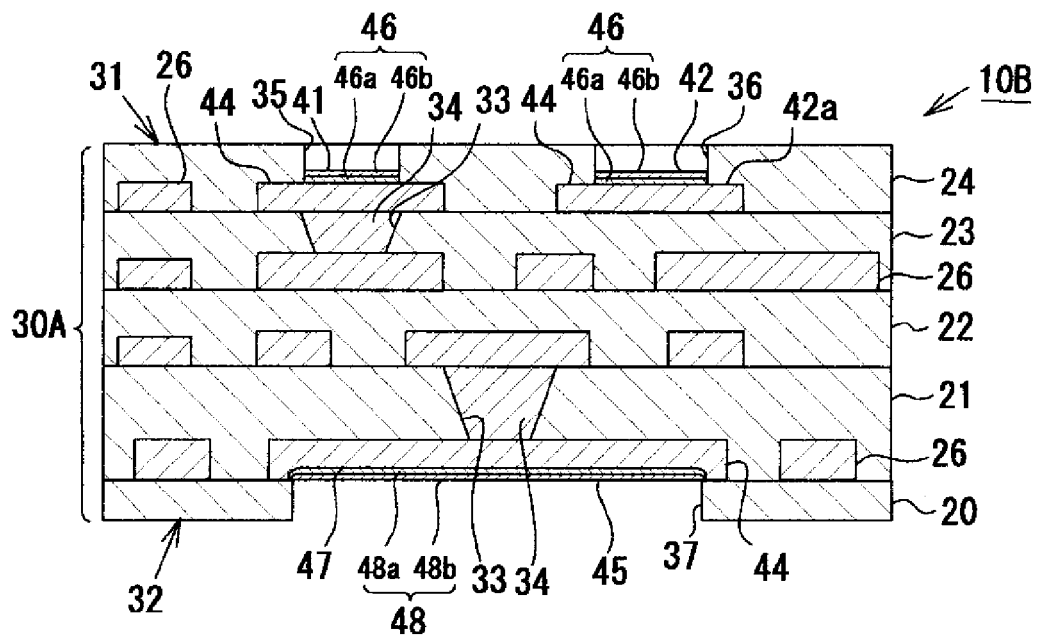
FIG. 15 is an enlarged sectional view schematically showing the structure of a multilayer wiring substrate according to another embodiment.
Figure 16:
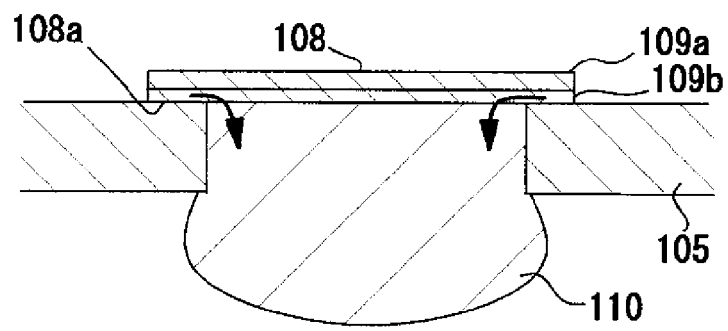
FIG. 16 is an enlarged sectional view showing a conventional wiring substrate.

In the multilayer wiring substrates 10, 10A of the above-described embodiments, the nickel plating layer 46a of each of the IC-chip connection terminals 41 and the capacitor connection terminals 42 is formed through two plating steps; i.e., nickel electroplating in the build-up step and electroless nickel plating after the base material removing step. However, the present invention is not limited thereto. Specifically, after the base material removing step, only electroless gold plating may be performed, with the electroless nickel plating after the base material removing step being omitted. FIG. 15 shows a specific example of a multilayer wiring substrate 10B fabricated by this method. In the multilayer wiring substrate 10B of FIG. 15, the nickel plating layer 46a, which covers the copper layer 44 of each connection terminal 41, 42 is formed to have a substantially uniform thickness, and the surface of the nickel plating layer 46a is flush with the outer surface 23a of the outermost resin insulation layer 23. In this multilayer wiring substrate 10B as well, since the connection terminals 41, 42 and the conductor layers 26 are buried in the outermost resin insulation layer 23, the insulation reliability of the multilayer wiring substrate 10B can be enhanced. Furthermore, since the outer surfaces of the conductor layers 26 formed on the outermost resin insulation layer 23 are covered by the nickel plating layer 28, migration of copper between wiring traces can be prevented reliably, whereby the degree of integration of the multilayer wiring substrate 10B can be increased.

In the multilayer wiring substrates 10, 10A, 10B of the above-described embodiments, the outermost conductor layers 26 are provided to be buried (embedded) in the resin insulation layer 23. However, the conductor layers 26 may be provided to be buried (embedded) in the solder resist layer 25. In this case, the nickel plating layer 28, which serves a conductive metallic layer, is formed on the outer surface (side and top surfaces) of the cupper layer 44 which constitutes each conductor layer 26. Notably, the conductive metallic layer is not limited to the plating layer, and may be a metallic layer formed by other methods, such as sputtering. Even in this case, migration of copper between the conductor layers 26 can be prevented.

In the multilayer wiring substrates 10, 10A, 10B of the above-described embodiments, the solder resist layer 25 is made primarily of a hardened photocurable resin material. However, the present invention is not limited thereto. The solder resist layer 25 may be formed by use of the same resin insulation material as the inner resin insulation layers 21 to 23; specifically, a build-up material made primarily of a hardened thermosetting epoxy resin. In this case, since the solder resist layer 25 is formed of a resin material which is the same as the resin material used to form the inner resin insulation layers 21 to 23 and which has an excellent insulation performance, the insulation reliability of the multilayer wiring substrate can be enhanced sufficiently. In addition, since difference in thermal expansion coefficient between layers of the multilayer wiring substrate can be reduced, warpage of the substrate can be suppressed.

In the above-described embodiments, the multilayer wiring substrates 10, 10A, 10B are fabricated by stacking the resin insulation layer 21 to 23 and the conductor layers 26 from the top surface 31 (first main surface) side where the IC-chip connection terminals 41 and the capacitor connection terminals 42 are formed. However, the present invention is not limited thereto. The multilayer wiring substrates may be fabricated by stacking the resin insulation layer 21 to 23 and the conductor layers 26 from the bottom surface 32 (second main surface) side where the motherboard connection terminals 45 are formed. In this case, the motherboard connection terminals 45 are buried in the outermost resin insulation layer 21 in contact with the solder resist layer 29. Further, the conductor layers 26 are provided at the interface between the solder resist layer 29 and the resin insulation layer 21, and the conductor layers 26 are also buried in the outermost resin insulation layer 21. Each of the outermost conductor layers 26 is composed of the copper layer 27 (main body) and the nickel plating layer 28, which covers the outer surface of the copper layer 27. Moreover, the plurality of the conductor layers 26 formed in the plurality of resin insulation layers 21 to 23 are connected with one another via the via conductors 34 whose diameter increases from the bottom surface 32 side toward the top surface 31 side. Even in the case where the multilayer wiring substrate is configured as described above, since the outer surface of the copper layer 27, which constitutes each conductor layer 26, is covered by the nickel plating layer 28, occurrence of migration of copper between the conductor layers 26 can be prevented, and the degree of integration of the multilayer wiring substrate can be increased.

In the above-described embodiments, each of the plating layers 46, 48 (coating metallic layers) covering the connection terminals 41, 42, 45 is a nickel-gold plating layer. However, any plating layer may be used so long as the plating layer is made of metal other than copper. For example, the nickel-gold plating layer may be replaced with any other plating layer such as a nickel-palladium-gold plating layer. In the above-described embodiments, the nickel plating layer 28 is formed as a conductive metallic layer covering the outer surface of the copper layer 27 of the conductor layer 26. However, the present invention is not limited thereto. The conductive metallic layer may be formed of any metal which is less likely to cause migration as compared with copper. For example, the nickel plating layer 28 may be replaced with a metallic layer made primarily of gold, chromium, tungsten, platinum, palladium, tin, lead, cobalt, molybdenum, tantalum, or titanium.

Next, technical ideas that the embodiments described above implement are enumerated below.

(1) In the multilayer wiring substrate according to any one of Means 1, the coating metallic layer which partially constitutes each of the first-main-surface-side connection terminals or the second-main-surface-side connection terminals is composed of a nickel plating layer and a gold plating layer; the nickel plating layer is provided to cover the outer surface of the copper layer; and the gold plating layer is provided to cover only a portion of the nickel plating layer exposed from an opening of the resin insulation layer for resist.

(2) In the multilayer wiring substrate according to the technical idea (1), the terminal outer surfaces of the first-main-surface-side connection terminals or the second-main-surface-side connection terminals are located on the inner layer side in relation to the surface of the outermost resin insulation layer.

(3) In the multilayer wiring substrate according to the technical idea (1) or (2), the resin insulation layer for resist is in contact with a peripheral portion of the nickel plating layer which covers the copper layer.

(4) In the multilayer wiring substrate according to any one of Means 1, the via conductors formed in the plurality of resin insulation layers increase in diameter from the first-main-surface side toward the second-main-surface side.

(5) In the multilayer wiring substrate according to any one of Means 1, the resin insulation layer for resist and the outermost resin insulation layer are formed primarily of the same resin insulation material.

DESCRIPTION OF REFERENCE NUMERALS 10, 10A, 10B: multilayer wiring substrate
21 to 23: resin insulation layer
25: solder resist layer (resin insulation layer for resist)
26: conductor layer (wiring conductor portion)
27: copper layer
28: nickel plating layer (conductive metallic layer)
30: wiring laminate portion (laminate structure)
31: top surface (first main surface)
32: bottom surface (second main surface)
34: via conductor
35, 36: opening
41: IC-chip connection terminal (first-main-surface-side connection terminal)
42: capacitor connection terminal (first-main-surface-side connection terminal)
44: copper layer
45: motherboard connection terminal (second-main-surface-side connection terminal)
46, 48: plating layer (coating metallic layer)

What is claimed is:

1. A multilayer wiring substrate comprising a laminate structure in which a plurality of resin insulation layers made primarily of a same resin insulation material, and a plurality of wiring conductor portions are laminated alternately in multilayer arrangement, a plurality of first-main-surface-side connection terminals being disposed on a first main surface side of the laminate structure, a plurality of second-main-surface-side connection terminals being disposed on a second main surface side of the laminate structure, the plurality of wiring conductor portions being formed in the plurality of resin insulation layers and interconnected by means of via conductors whose diameters increase toward the first main surface side or the second main surface side, wherein:
 a solder resist layer having a plurality of openings is disposed on the first main surface side or the second main surface side of the laminate structure;
 each of the plurality of first-main-surface-side connection terminals or the plurality of second-main-surface-side connection terminals comprises a copper layer and a coating metallic layer entirely covering a top end surface of the copper layer, and is at least partially embedded in an outermost resin insulation layer in contact with the solder resist layer;
 a top end surface of the coating metallic layer is at least partially covered by and in contact with the solder resist layer, and the top end surface of the coating metallic layer that is covered by and in contact with the solder resist layer does not comprise gold;
 each of outermost wiring conductor portions present at an interface between the solder resist layer and the outermost resin insulation layer comprises a copper layer and a conductive metallic layer covering a top end surface of the copper layer; and
 the conductive metallic layer comprises at least one conductive metal selected from gold, chromium, tungsten, platinum, palladium, tin, lead, nickel, cobalt, molybdenum, tantalum, and titanium.

2. The multilayer wiring substrate according to claim 1, wherein the outermost wiring conductor portions are embedded in the outermost resin insulation layer.

3. The multilayer wiring substrate according to claim 1, wherein the solder resist layer is disposed on the first main surface side of the laminate structure, and a plurality of IC-chip connection terminals, to which an IC chip is to be connected, are present on the first main surface side as the first-main-surface-side connection terminals.

4. The multilayer wiring substrate according to claim 1, wherein the coating metallic layer of each of the plurality of first-main-surface-side connection terminals or the plurality of second-main-surface-side connection terminals, and the conductive metallic layer of each of the outermost wiring conductor portions are made primarily of nickel or gold.

5. The multilayer wiring substrate according to claim 4, wherein each of the coating metallic layer and the conductive metallic layer is made primarily of nickel.

6. The multilayer wiring substrate according to claim 1,
 wherein each coating metallic layer comprises a nickel plating layer and a gold plating layer,
 wherein the nickel plating layer covers the top end surface of the copper layer, and
 wherein the gold plating layer covers only a portion of the nickel plating layer exposed from an opening of the solder resist layer.

7. The multilayer wiring substrate according to claim 1, wherein the terminal outer surfaces of the first-main-surface-side connection terminals or the second-main-surface-side connection terminals are recessed from an outer surface of the solder resist layer.

8. The multilayer wiring substrate according to claim 6, wherein the solder resist layer is in contact with a peripheral portion of the nickel plating layer which covers the copper layer.

9. The multilayer wiring substrate according to claim 1, wherein the via conductors formed in the plurality of resin insulation layers increase in diameter from the first main surface side toward the second main surface side.

10. The multilayer wiring substrate according to claim 1, wherein the solder resist layer and the outermost resin insulation layer are primarily comprised of the same resin insulation material.

* * * * *